United States Patent
Xia et al.

(10) Patent No.: US 7,493,939 B2
(45) Date of Patent: Feb. 24, 2009

(54) HEAT SINK WITH HEAT PIPES

(75) Inventors: Wan-Lin Xia, Guangdong (CN); Tao Li, Guangdong (CN); Min-Qi Xiao, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 467 days.

(21) Appl. No.: 11/164,167

(22) Filed: Nov. 13, 2005

(65) Prior Publication Data

US 2007/0107876 A1 May 17, 2007

(51) Int. Cl.
*F28D 15/00* (2006.01)
*H05K 7/20* (2006.01)

(52) U.S. Cl. .................... 165/104.26; 165/104.33; 361/700

(58) Field of Classification Search ............ 165/104.26, 165/104.33; 361/700
See application file for complete search history.

(56) References Cited

U.S. PATENT DOCUMENTS

| | | | |
|---|---|---|---|
| 6,148,906 A | 11/2000 | Li et al. | |
| 6,424,528 B1 * | 7/2002 | Chao | ..................... 361/700 |
| 6,779,595 B1 * | 8/2004 | Chiang | .................. 165/104.33 |
| 6,807,058 B2 | 10/2004 | Matteson et al. | |
| 7,278,470 B2 * | 10/2007 | Xia et al. | ............... 165/104.33 |
| 7,343,962 B2 * | 3/2008 | Xia et al. | .................. 165/80.3 |
| 2005/0067144 A1 * | 3/2005 | Chou | ........................ 165/80.3 |
| 2006/0082972 A1 * | 4/2006 | Kim | ........................... 361/709 |
| 2006/0203451 A1 * | 9/2006 | Wei et al. | ..................... 361/700 |
| 2007/0000646 A1 * | 1/2007 | Chen et al. | ............. 165/104.33 |
| 2007/0074857 A1 * | 4/2007 | Xia et al. | ............... 165/104.33 |
| 2007/0107871 A1 * | 5/2007 | Xia et al. | .................. 165/80.3 |
| 2008/0173430 A1 * | 7/2008 | Jin et al. | ............... 165/104.33 |
| 2008/0173431 A1 * | 7/2008 | Yang et al. | ............. 165/104.33 |

FOREIGN PATENT DOCUMENTS

| | | |
|---|---|---|
| CN | 2664187 | 12/2004 |
| JP | 2004311718 A * | 11/2004 |
| TW | M267830 | 6/2005 |

OTHER PUBLICATIONS

Machine Translation of JP2004311718.*

* cited by examiner

*Primary Examiner*—Cheryl J. Tyler
*Assistant Examiner*—Brandon M Rosati
(74) *Attorney, Agent, or Firm*—Winston Hsu

(57) ABSTRACT

A heat sink includes a base (10) and heat pipes (20). The base includes a bottom surface contacting with a heat-generating electronic component (100), an upper surface defining grooves (12) receiving the heat pipes therein. Evaporating sections (22) of the heat pipes are located near a first end portion (10a) and condensing sections (24) of the heat pipes are located near a second end portion (10b) of the base. A first fin assembly (30) is mounted on the upper surface and a second fin assembly (40) is mounted on the bottom surface of the base near the second end portion thereof. A fan (200) is located near the second end portion of the base.

13 Claims, 4 Drawing Sheets

HEAT SINK WITH HEAT PIPES

FIELD OF THE INVENTION

The present invention relates to a heat sink for removing heat from a heat-generating electronic device, and more particularly to a heat sink having heat pipes embedded in the heat sink. The heat pipe extends from an end portion of the base to an opposite end portion of the base.

DESCRIPTION OF RELATED ART

Over the past few years, a CPU's operation speed has been increasing at a dramatic rate. In order to speedily process more information, the CPU must have more transistors, draw more power and have a higher clock rate. This leads to a great deal of heat produced by the CPU in the computer. If not been removed in time, the heat can accumulate on and overheat the CPU, resulting in degradation of reliability and system malfunction.

Heat sink with heat pipes has been added to all modern CPUs to alleviate the effect of the heat on the processors by enforcing heat dissipation into the surrounding environment. A typical heat sink with heat pipes comprises a base contacting a heat-generating electronic component like the CPU, a plurality of fins arranged on the base and heat pipes having evaporating portions sandwiched between the base and the fins and condensing portion extending upwardly through the fins. A plurality of grooves for accommodating the heat pipes is defined in a middle part of the base corresponding to the heat-generating electronic component. Most of the heat generated by the heat-generating electronic component is absorbed by the base, then conducted upwardly to the fins via the heat pipes for further dissipating to ambient air. However, the heat from the heat-generating electronic component is evenly distributed on the base via the heat pipes, so the base fails to form a temperature gradient between one portion of the base and another portion of the base. The heat received in each heat pipe cannot be very quickly transferred from the evaporating end of the heat pipe, which has a higher temperature, to the condensing end of the heat pipe, which has a lower temperature. Heat transferred efficiency of the heat pipes is poor. Heat-transferred speed of the base to the fins needs improvement greatly. Thus, a heat sink with heat pipes, which can form a maximum temperature gradient from one portion of the heat sink to another portion thereof is needed.

SUMMARY OF INVENTION

Accordingly, what is needed is a heat sink which maximizes a temperature gradient on a base of the heat sink to thereby enhance heat-transfer performance of heat pipes embedded in the heat sink.

A heat sink in accordance with a preferred embodiment of the present invention comprises a base and heat pipes disposed in the base. The base comprises a bottom surface contacting with a heat-generating electronic component, an upper surface opposite the bottom surface, and grooves defined in the upper surface of the base receiving the heat pipes therein. The heat sink further comprises a fan. Each heat pipe comprises an evaporating section and a condensing section, wherein the evaporating sections of the heat pipes are located near a first end portion of the base, and the condensing portions are located near a second end portion of the base opposite the first end portion. A first fin assembly is mounted on the upper surface of the base, and a second fin assembly is mounted on the bottom surface of the base located near the second end portion of the base and corresponding to the condensing sections of the heat pipes, to thereby enhance heat dissipation of the condensing sections of the heat pipes to ambient air and maximize a temperature gradient on the base of the heat sink, so that heat absorbed by the base from the heat-generating component can be quickly spread to the second end portion of base. The fan is mounted adjacent to the second end portion of the base.

Other advantages and novel features will become more apparent from the following detailed description of preferred embodiments when taken in conjunction with the accompanying drawings, in which:

DETAILED DESCRIPTION

Figure 1:
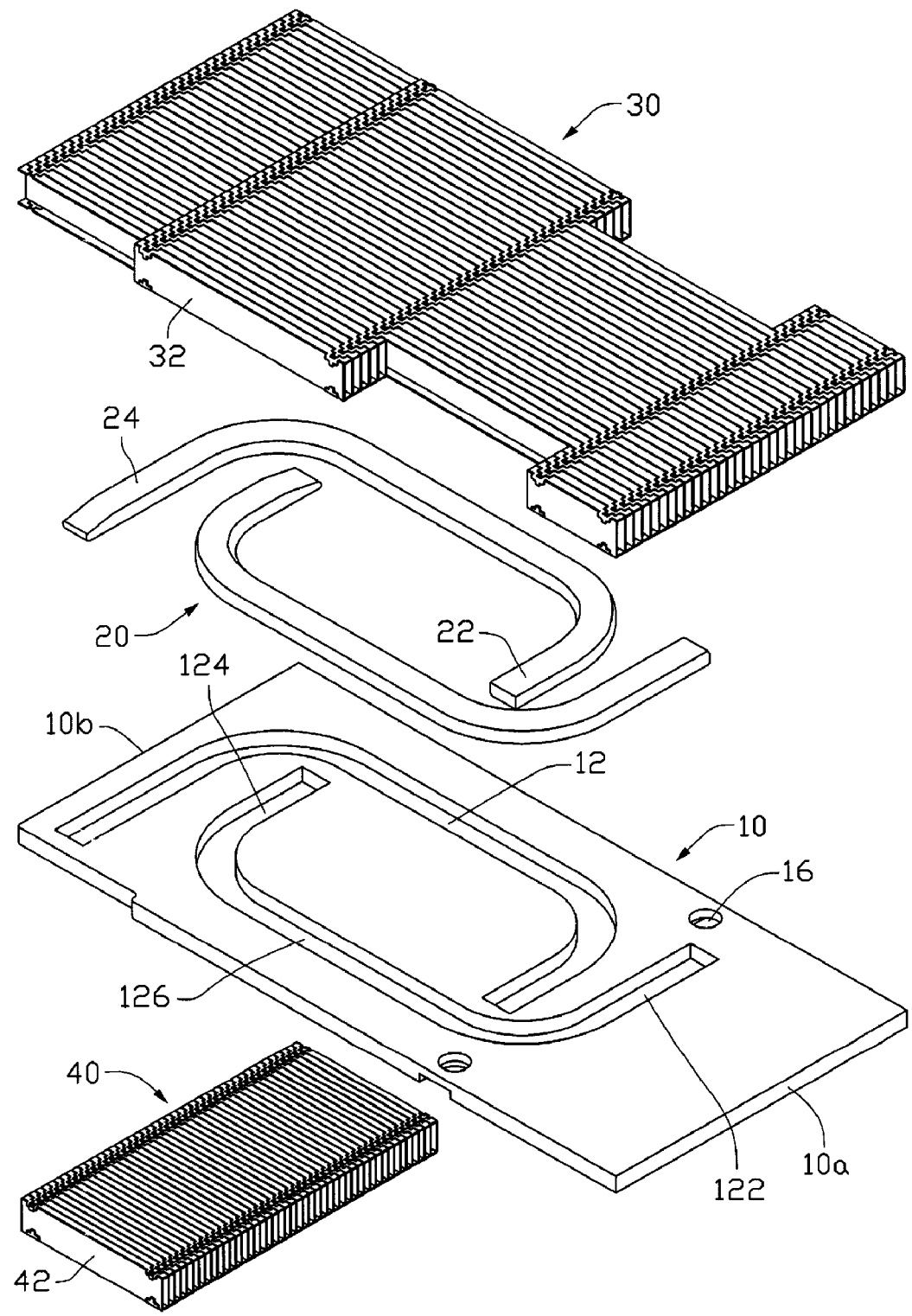
FIG. 1 shows an exploded view of a heat sink in accordance with a preferred embodiment of the present invention, including a base and heat pipes and two fin assemblies.
Figure 2:
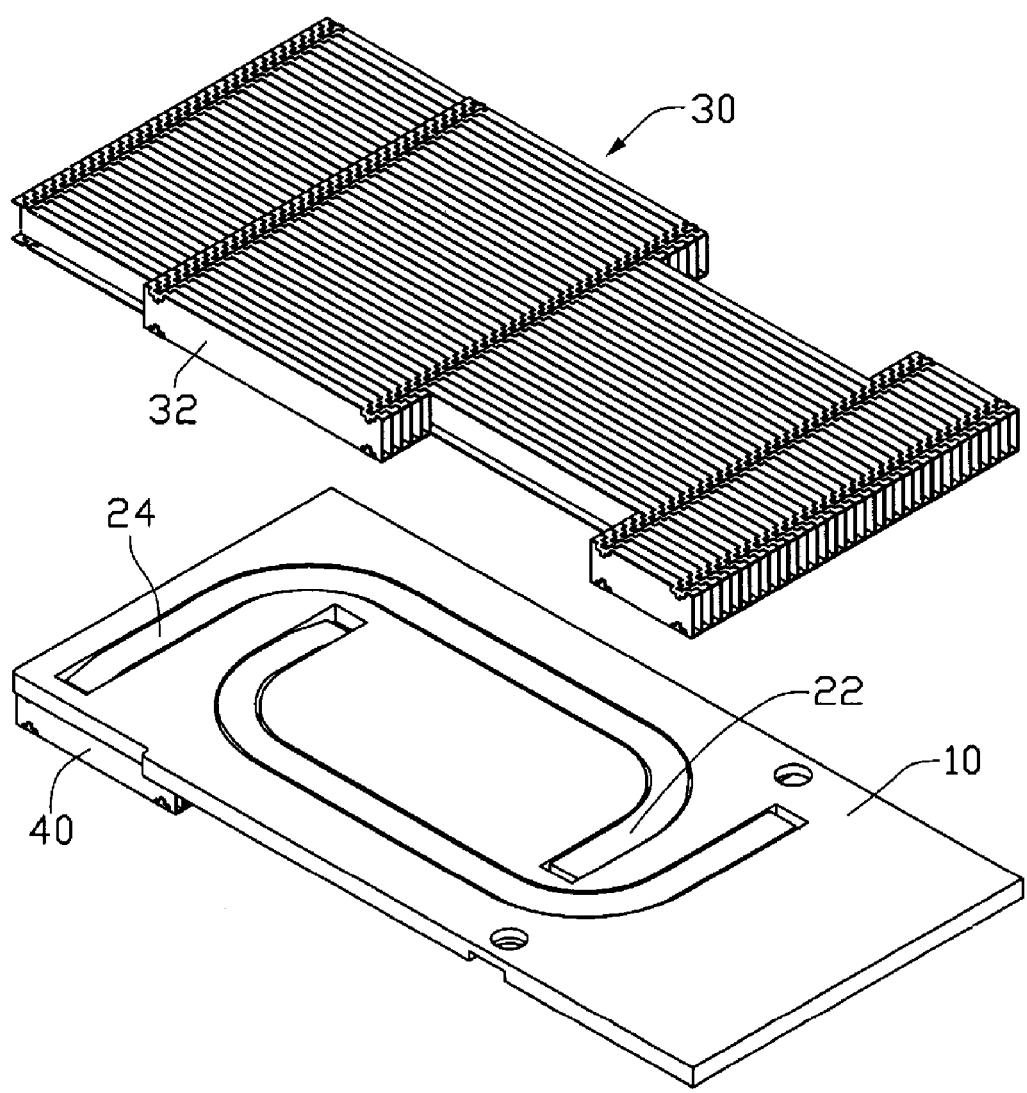
FIG. 2 is a partially assembled view of the heat sink of FIG. 1.

Referring to FIGS. 1-4, a heat sink in accordance with a preferred embodiment of the present invention comprises a base 10, two heat pipes 20 arranged on the base 10, a first fin assembly 30 and a second fin assembly 40 respectively disposed on upper and bottom surfaces of the base 10.

The base 10 is rectangular, and comprises a pair of long sides and a pair of short sides. The base 10 comprises a first end portion 10a and a second end portion 10b opposite the first end portion 10a. The first and second end portions 10a, 10b are coincident with the short sides of the base 10. A pair of grooves 12 is defined in the upper surface of the base 10 to receive the heat pipes 20 therein. The heat pipes 20 are flattened. The grooves 12 are U-shaped and extend from a portion of the base 10 near the first end portion 10a to a portion thereof near the second end portion 10b. Each groove 12 comprises a first depressed portion 122 located near the first end portion 10a of the base 10. The first depressed portion 122 is located corresponding to a heat-generating electronic component 100 (clearly seen in FIG. 3), such as a CPU, attached on the bottom surface of the base 10. Furthermore, each groove 12 includes a second depressed portion 124 located near the second end portion 10b of the base 10 and a third depressed portion 126 connecting the first depressed portion 122 and the second depressed portion 124. The first and second depressed portions 122, 124 are parallel to the first and second end portions 10a, 10b and the third depressed portion 126 is parallel to the long sides of the base 10 between the end portions 10a, 10b. The second depressed portion 124 of each groove 12 extends far away from the corresponding first depressed portion 122. Two through holes 16 are defined in the base 10 near the first end portion 10a so that two fasteners (not shown) such as screws can be extended through the base 10 to engage retainers on a PCB (not shown) on which the electronic component 100 is mounted to thereby enable the heat sink to have an intimate contact with the electronic component 100.

The heat pipes 20 are U-shaped and each heat pipe 20 comprises an evaporating section 22 arranged in the first depressed portion 122 and a condensing section 24 arranged in the second depressed portion 124 by soldering or adhering.

Since the heat pipes 20 are flattened, they form a flat top surface together with the upper surface of the base 10 so that the first fin assembly 30 can be attached to the upper surface of the base 10. In combination of the heat pipes 20 and the base 10, the heat pipes 20 are juxtaposed to each other. The condensing sections 24 are located near and parallel to each other. The evaporating sections 22 are located near and parallel to each other. The evaporating sections 22 are closely arranged in the first depressed portions 122 and the first depressed portions 122 have the highest temperature than the other parts of the base 10 since the first depressed portions 122 are located directly above the heat-generating electronic component 100. The evaporating section 22 of one of the heat pipes 20 is disposed between the evaporating section 22 and the condensing section 24 of the other heat pipe 20. The condensing section 24 of one of the heat pipes is disposed between the condensing section of the other heat pipe and the second end portion 10b of the base 10.

Figure 3:
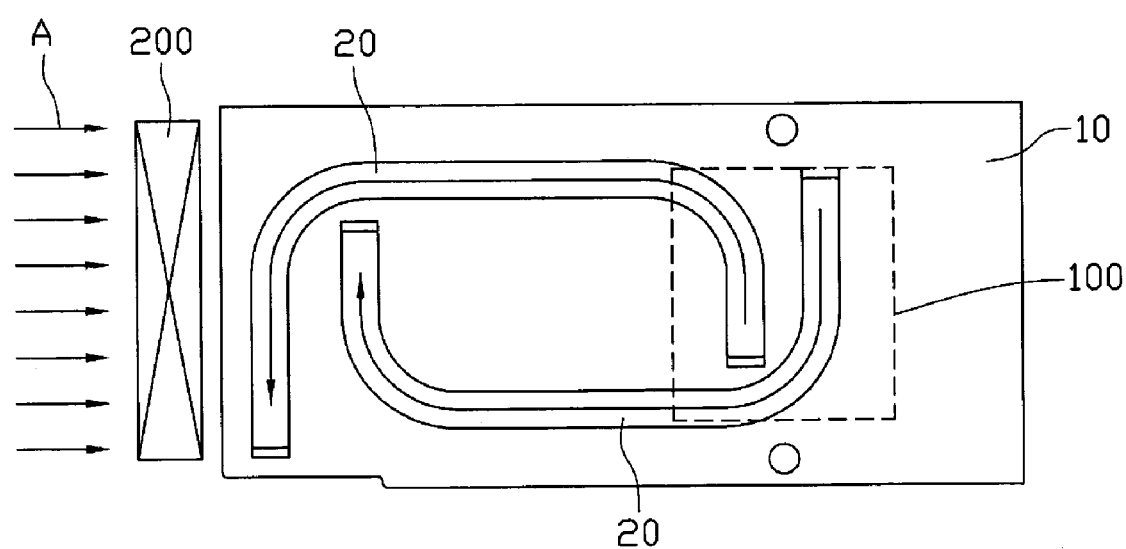
FIG. 3 is a top view of an assembly of the base and the heat pipes of FIG. 1, showing heat transferring paths in the heat pipes when the heat sink of FIG. 1 works.
Figure 4:
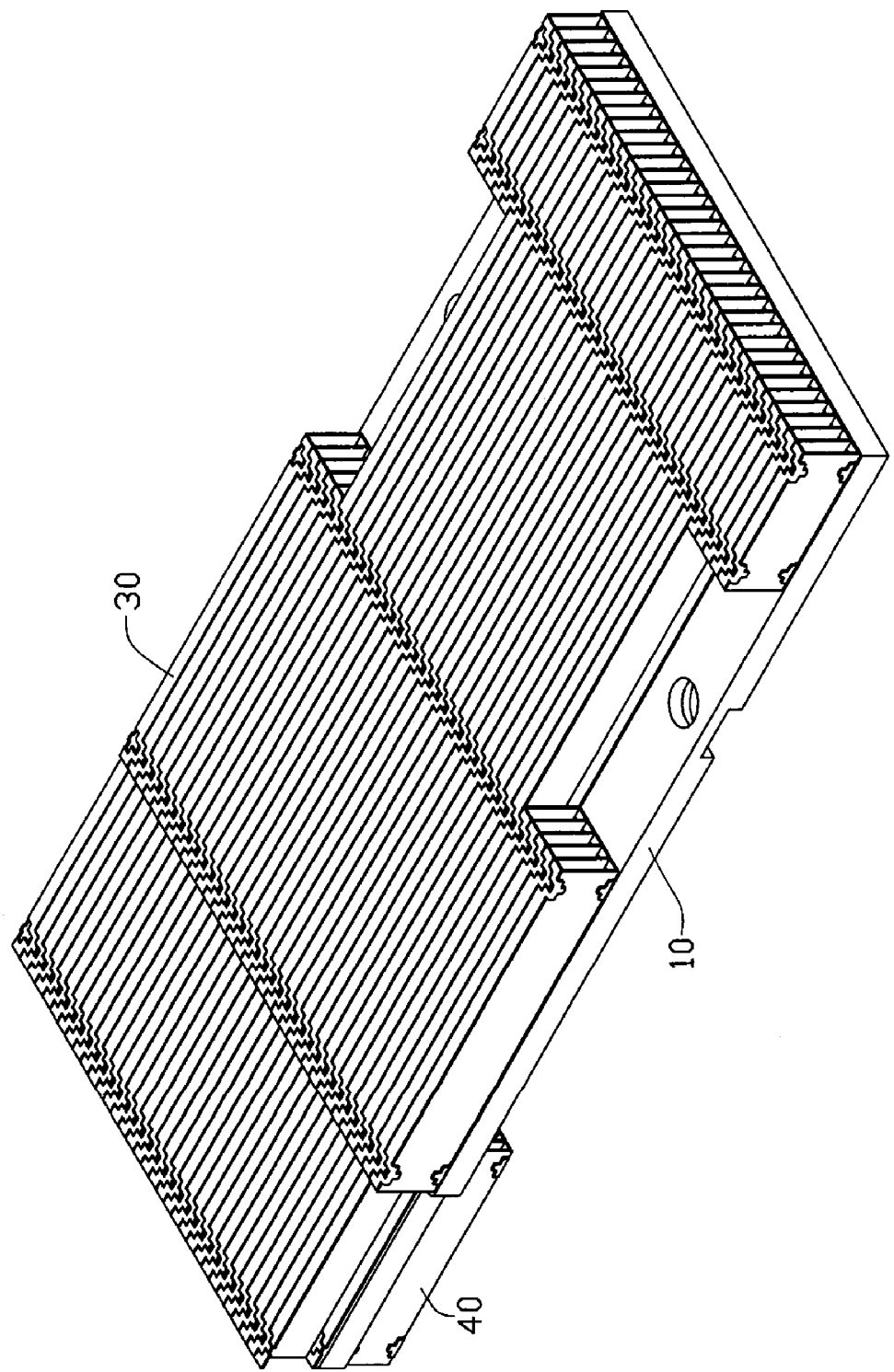
FIG. 4 is an assembled view of the heat sink of FIG. 1.

The first fin assembly 30 comprises a plurality of individual first fins 32 arranged side by side. Each first fin 32 defines flanges (not labeled) respectively at top and bottom ends thereof. The flanges are oriented toward a same direction. A plurality of passages (not labeled) is formed between adjacent first fins 32. The first fin assembly 30 is mounted on the upper surface of the base 10 by soldering or adhering so that the heat pipes 20 are completely sandwiched between the base 10 and the first fin assembly 30 and thermally connected therewith. Thus, the first fin assembly 30 can directly absorb heat from the heat pipes 20 and the base 10. The second fin assembly 40 comprises a plurality of individual second fins 42 arranged side by side and forms a plurality of passages (not labeled) between adjacent second fins 42. The second fin assembly 40 is shorter than the first fin assembly 30 and is arranged on the bottom surface of the second end portion 10b of the base 10 and located corresponding to the second depressed portions 124. Moreover, a fan 200 is disposed adjacent the second end portion 10b of the base 10 corresponding to the condensing sections 24 of the heat pipes 20. The fan 200 produces an airflow indicated by arrows A as shown in FIG. 3. The airflow flows toward the second end portion 10b of the base 10 in a direction parallel to the base 10. The second fin assembly 40 is thermally connected with the condensing sections 24 of the heat pipes 20.

FIG. 3 shows heat transferring paths of the heat pipes 20 of the heat sink. When the heat sink is used, heat generated by the electronic component 100 is conducted to the portion of the base 10 near the first end portion 10a and received by the evaporating sections 22 of the heat pipes 20. The heat causes liquid in the evaporating portions 22 of the heat pipes 20 to evaporate and then is quickly transferred to the condensing sections 24 of the heat pipes 20 as shown by curved arrows in the heat pipes 20 of FIG. 3. Finally, the heat at the condensing sections 24 of the heat pipes 20 is discharged to the first and second fin assemblies 30, 40 and the portion of the base 10 near the second end portion 10b. The airflow (shown as arrows A) generated from the fan 200 disposed adjacent the second end portion 10b of the base 10 flows into the passages defined between the first fins 32 and the second fins 42 to enhance heat dissipation from the fin assemblies 30, 40 to ambient air. Thus, the portion of the base 10 near the second end portion 10b of the base 10 and the condensing sections 24 of the heat pipes 20 can be quickly cooled. A large temperature gradient is thus achieved between the portions of the base respectively near the first and second end portions 10a, 10b of the base 10, because the portion of the base near the first end portion 10a is close to the heat-generating electronic component 100 and the portion of the base near the second end portion 10b is remote from the heat-generating electronic component 100 and can be cooled quickly. A result of the large temperature gradient is that the heat pipes 20 are sufficiently used to transfer heat from the portion of the base 10 near the first end portion 10a where the highest temperature exists to the portion of the base 10 near the second end portion 10b where the lowest temperature exists, to efficiently dissipate the heat of the electronic component 100. Therefore, heat of the electronic component 100 is continuously transferred to the portion of the base 10 near the second end portion 10b via the heat pipes 20 and dissipated by the first and second fin assemblies 30, 40 to ambient air. The heat dissipation efficiency of the heat sink can thus be improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink with heat pipes comprising:
    a base comprising a bottom surface for contacting with a heat-generating electronic component, an upper surface opposite the bottom surface, and a plurality of grooves defined in the upper surface of the base;
    a plurality of heat pipes received in the grooves, respectively, each heat pipe comprising an evaporating section and a condensing section; and
    a fin assembly attached on the bottom face of the base corresponding to the condensing sections of the heat pipes;
    wherein the evaporating sections of the heat pipes are closely arranged on a portion of the base adjacent to an end of the base and in alignment with the heat-generating component for thermally connecting with the heat-generating component, and wherein the condensing sections of the heat pipes extend away from said portion of the base to another end of the base;
    wherein the heat pipes comprise a pair of U-shaped heat pipes each defining an opening side facing toward each other, and one of the evaporating section and the condensing section of one of the heat pipes is located between the evaporating section and the condensing section of another one of the pair of heat pipes.

2. The heat sink with heat pipes as claimed in claim 1, further comprising a fan disposed adjacent the another end of the base, airflow produced by the fan flowing to the another end of the base.

3. The heat sink with heat pipes as claimed in claim 1, wherein the heat pipes are arranged side by side with each other.

4. The heat sink with heat pipes as claimed in claim 1, wherein the condensing sections of the heat pipes are arranged close to each other.

5. The heat sink with heat pipes as claimed in claim 1, wherein the evaporating and condensing sections of each heat pipe are arranged parallel to each other.

6. The heat sink with heat pipes as claimed in claim 1, further comprising an additional fin assembly securely attached on the upper surface of the base so that the heat pipes are sandwiched between the base and the additional fin assembly.

7. A heat sink with heat pipes comprising:
    a base having a bottom face for contacting with a heat-generating electronic component and a top face defining two grooves therein, each groove having a first depressed portion corresponding to the heat-generating electronic component and a second depressed portion extending away from the first groove to an end of the base;

two heat pipes attached on the base and received in the two grooves, respectively, each heat pipe comprising an evaporating section which is received in the first depressed portion and located adjacent to an end of the base and a condensing section which is received in the second depressed portion and located adjacent to another end of the base;

a first fin assembly mounted on the bottom face of the base corresponding to the condensing sections of the two heat pipes; and a fan disposed adjacent the another end of the base;

wherein the two heat pipes are U-shaped, each heat pipe defines an opening side facing toward each other, and one of the evaporating section and the condensing section of one of the two heat pipes is located between the evaporating section and the condensing section of another one of the two heat pipes.

8. The heat sink with heat pipes as claimed in claim 7, wherein the condensing sections of the two heat pipes are arranged parallel to the another end of the base.

9. The heat sink with heat pipes as claimed in claim 7, wherein the first fin assembly comprises a plurality of first fins and forms a plurality of first passages between adjacent first fins, airflow produced by the fan being flowed into the first passages.

10. The heat sink with heat pipes as claimed in claim 7, further comprising a second fin assembly mounted on the top face of the base.

11. The heat sink with heat pipes as claimed in claim 10, wherein airflow produced by the fan flows into the first and second fin assemblies.

12. The heat sink with heat pipes as claimed in claim 10, wherein the second fin assembly comprises a plurality of second fins and forms a plurality of second passages between adjacent second fins, airflow produced by the fan being flowed into the second passages.

13. The heat sink with heat pipes as claimed in claim 8, wherein the two heat pipes are flattened so that the heat pipes and the top face of the base together form a flat surface when the two heat pipes are assembled in the base.

* * * * *